(12) United States Patent
Douchi et al.

(10) Patent No.: US 6,466,075 B2
(45) Date of Patent: Oct. 15, 2002

(54) CLOCK SIGNAL GENERATOR FOR GENERATING SIGNAL WITH DIFFERING PHASE FOR AN INTEGRATED CIRCUIT

(75) Inventors: Hiroko Douchi, Kawasaki (JP); Hiroyoshi Tomita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/826,358

(22) Filed: Apr. 5, 2001

(65) Prior Publication Data

US 2001/0011916 A1 Aug. 9, 2001

Related U.S. Application Data

(62) Division of application No. 09/385,007, filed on Aug. 27, 1999, now Pat. No. 6,275,086.

(30) Foreign Application Priority Data

Nov. 19, 1998 (JP) ............................................. 10-329369
Aug. 23, 1999 (JP) ............................................. 11-236030

(51) Int. Cl.[7] ................................................. H03K 5/13
(52) U.S. Cl. ...................................... 327/296; 327/295
(58) Field of Search ................................. 327/291, 293, 327/294, 296, 299, 141, 144, 146, 154, 155; 365/233

(56) References Cited

U.S. PATENT DOCUMENTS

| | | | |
|---|---|---|---|
| 4,816,700 A | 3/1989 | Imel | 327/154 |
| 5,623,223 A | 4/1997 | Pasqualini | 327/298 |
| 5,692,164 A | 11/1997 | Pantelakis | 395/556 |
| 5,828,243 A | 10/1998 | Bagley | 327/99 |
| 5,838,630 A | 11/1998 | Okajima | 365/233 |
| 5,886,562 A | 3/1999 | Garrity et al. | 327/415 |
| 5,889,709 A | 3/1999 | Fukuda | 365/189.05 |
| 6,028,461 A | 2/2000 | Kobayashi | 327/155 |
| 6,275,086 B1 * | 8/2001 | Douchi et al. | 327/296 |

* cited by examiner

Primary Examiner—Tuan T. Lam
(74) Attorney, Agent, or Firm—Arent Fox Kintner Plotkin & Kahn

(57) ABSTRACT

A clock signal generator which is particularly useful for a double data rate SDRAM (DDR-SDRAM) includes two or more clock signal input buffers and an enable signal input buffer. The clock signal generator generates internal clock signals that fluctuate at substantially different timings, yet the relationship between the internal clock signals with respect to validation and invalidation timing is constant. A latch circuit latches an enable signal from the enable signal buffer in accordance with a first internal clock signal from a first one of the clock signal buffers. A first enable signal connected to the latch circuit holds the latched enable signal in accordance with the first internal clock signal. A second enable circuit receives the first enable signal and the first internal clock signal and generates a second enable signal used to activate the clock signal buffers. A logic gate receives the first enable signal and the first internal clock signal and controls the output of the first internal clock signal.

10 Claims, 13 Drawing Sheets

CLOCK SIGNAL GENERATOR FOR GENERATING SIGNAL WITH DIFFERING PHASE FOR AN INTEGRATED CIRCUIT

This application is a division of application Ser. No. 09/385,007 filed on Aug. 27, 1999, now U.S. Pat. No. 6,275,086. The disclosure of the prior application is hereby incorporated by reference herein in its entirety.

BACKGROUND OF THE INVENTION

The present invention relates to semiconductor integrated circuits, and more particularly, to a clock signal generator for a semiconductor integrated circuit that generates clock signals having a plurality of differing phases.

A conventional synchronous dynamic random access memory (SDRAM) generates an internal clock signal using external clock signals sent from an SDRAM controller and provides the internal clock signal to internal circuits. The SDRAM validates and invalidates the internal clock signal in accordance with an external power-down signal (clock enable signal) sent from the SDRAM controller. More specifically, the generation of the internal clock signal is stopped if the external power-down signal is low regardless of whether the external clock signal is provided. The internal clock signal is generated from the external clock signal when the external power-down signal is high.

FIG. 1 is a schematic block diagram illustrating an internal clock signal generating circuit 100. The generating circuit 100 receives an external clock signal CLK and an external power-down signal (clock enable signal) CKE and uses these signals to generate an internal clock signal CLKMZ. Furthermore, the generating circuit 100 includes a clock signal input buffer 91, a power-down signal input buffer 92, a clock signal monitor input buffer 93, a latch circuit 94, and an enable signal generating circuit 95.

The clock signal input buffer 91, which is preferably a current mirror type input buffer, receives the external clock signal CLK from an SDRAM controller and provides each internal circuit (not shown) with the clock signal CLKMZ, which phase is substantially the same as the external clock signal CLK. The buffer 91 is activated by a high enable signal ENZ and deactivated by a low enable signal ENZ. Thus, the buffer 91 outputs the internal clock signal CLKMZ if the enable signal ENZ is high and inhibits the output of the internal clock signal CLKMZ when the enable signal ENZ is low regardless of whether the external clock signal CLK is provided, as shown in FIG. 2. The enable signal ENZ is generated by the power-down signal input buffer 92, the clock signal monitor input buffer 93, the latch circuit 94, and the enable signal generating circuit 95.

The power-down signal input buffer 92, which is preferably a current mirror type input buffer, receives the external power-down signal CKE from the SDRAM controller and generates a main power-down signal CKEMZ, which phase is substantially the same as the external power-down signal CKE. That is, the buffer 92 outputs a high main power-down signal CKEMZ if the external power-down signal CKE is high (non-power-down state) and outputs a low main power-down signal CKEMZ if the external power-down signal CKE is low (power-down state).

The clock signal monitor input buffer 93, which is preferably a current mirror type input buffer, receives the external clock signal CLK from the SDRAM controller and generates a monitor internal clock signal CLKSZ, which phase is substantially the same as the external clock signal CLK. The buffer 93 is activated when either the main power-down signal CKEMZ or the enable signal ENZ is high and deactivated when both the main power-down signal CKEMZ and the enable signal ENZ are low. Thus, the buffer 93 outputs the monitor internal clock signal CLKSZ when activated and inhibits the output of the monitor internal clock signal CLKSZ when deactivated regardless of whether the external clock signal CLK is provided, as shown in FIG. 2.

The latch circuit 94 latches the main power-down signal CKEMZ when the monitor internal clock signal CLKSZ goes high and outputs the latched main power-down signal CKEMZ as the internal power-down signal CKECZ. Thus, the latch circuit 94 outputs a high or low internal power-down signal CKECZ when the monitor internal clock signal CLKSZ goes high.

The enable signal generating circuit 95 latches the internal power-down signal CKECZ when the monitor internal clock signal CLKSZ goes low and outputs the latched internal power-down signal CKECZ as the enable signal ENZ. Furthermore, the generating circuit 95 outputs the previously latched internal power-down signal CKECZ as the enable signal ENZ when the monitor internal clock signal CLKSZ goes high. In other words, the generating circuit 95 outputs a delayed low enable signal ENZ when the internal power-down signal CKECZ goes low and outputs a delayed high enable signal ENZ when the internal power-down signal CKECZ goes high. Therefore, the clock signal input buffer 91 outputs the internal clock signal CLKMZ when the enable signal ENZ, or the internal power-down signal CKECZ, is high. On the other hand, the buffer 91 does not output the internal clock signal CLKMZ when the internal power-down signal CKECZ is low.

A double-data-rate (DDR)-SDRAM has been proposed to satisfy the recent demand for increasing the speed of a data bus and an SDRAM. The DDR-SDRAM includes a clock signal generating circuit for receiving two external clock signals, each having a phase which differs by 180° from the other, and generating two internal clock signals, each having a phase which differs by 180° from the other, using the two external clock signals. The DDR-SDRAM further includes a first internal circuit section operated in accordance with a first internal clock signal and a second internal circuit section operated in accordance with a second internal clock signal. Data processing is divided between the first and second internal circuit sections to increase the operating speed of the DDR-SDRAM.

In the DDR-SDRAM, it is preferred that the two internal clock signals fluctuate at substantially different timings and that the relationship of the two internal clock signals with respect to the validation and invalidation timing is always constant. In other words, if the relationship between the first and second internal clock signals is always constant, for example, if the first internal clock signal is always validated or invalidated before the second internal clock signal, the number of processes executed by the first internal circuit section is the same as that executed by the second internal circuit section. Accordingly, the first and second internal circuit sections always execute processes under the same conditions.

If the validation and invalidation timings of the first and second internal clock signals change intermittently, the number of processes executed by the first internal circuit section is different from that executed by the second internal circuit section. This results in the processing conditions of the first internal circuit section differing from those of the second internal circuit section and hinders satisfactory processing.

The two internal clock signals are generated by two external clock signal input buffers. The external clock signal input buffers are activated by a high power-down signal and deactivated by a low power-down signal. Thus, the validation or invalidation timing of each internal clock signal is determined by the power-down signal.

However, the shifting of the power-down signal between a high level and a low level is carried out without regard to the external clock signal. Thus, when the power-down signal is shifted, the first internal clock signal may be validated or invalidated before or after the second internal clock signal. That is, the validation and invalidation timings of the first and second internal clock signals changes in accordance with the power-down signal. Therefore, the relationship between the first and second internal clock signals with respect to the validation and invalidation timing is not always constant.

Accordingly, it is an objective of the present invention to provide a semiconductor integrated circuit that always validates and invalidates two internal clock signals with a constant relationship.

SUMMARY OF THE INVENTION

To achieve the above objective, the present invention provides a semiconductor integrated circuit. The integrated circuit includes a plurality of clock signal input circuits. Each clock signal input circuit receives a respective one of plurality of external clock signals and generates a respective one of plurality of internal clock signals. An external control signal input circuit receives an external control signal and generates an internal control signal. An output control circuit receives the internal control signal from the external control signal input circuit and controls the output of the internal clock signals in accordance with changes in the internal control signal.

In a further aspect of the present invention, a semiconductor integrated circuit includes a first clock signal input buffer and a second clock signal input buffer for receiving first and second external clock signals, each having a different phase, and generating first and second internal clock signals, each having a different phase, respectively. A power-down signal input buffer receives an external power-down signal and generates an internal power-down signal. An output control circuit receives the internal power-down signal from the power-down signal input buffer and controls the output of the first and second internal clock signals in accordance with changes in the internal power-down signal.

In another aspect of the present invention, A semiconductor integrated circuit includes a plurality of clock signal input circuits, including at least a first clock signal input circuit and a second clock signal input circuit, for receiving a respective plurality of external clock signals, and generating a respective plurality of internal clock signals therefrom. An external control signal input circuit receives an external control signal and generates an internal control signal used to activate the plurality of clock signal input circuits. A latch circuit connected to the external control signal input circuit and the first clock signal input circuit latches the internal control signal in response to a first internal clock signal generated by the first clock signal input circuit. A first enable signal generating circuit, connected to the latch circuit and the first clock signal input circuit, holds the latched internal control signal in response to the first internal clock signal and generates a first enable signal. A gate circuit, connected to the first enable signal generating circuit and the first clock signal input circuit, receives the first enable signal and the first clock signal and controls the output of the first clock signal in accordance with the first enable signal. A second enable signal generating circuit, connected to the first enable signal generating circuit and the first clock signal input circuit, receives the first enable signal and the first internal clock signal and generates a second enable signal. The second enable signal is provided to the first and second clock signal input circuits to control the output of the first and second internal clock signals.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
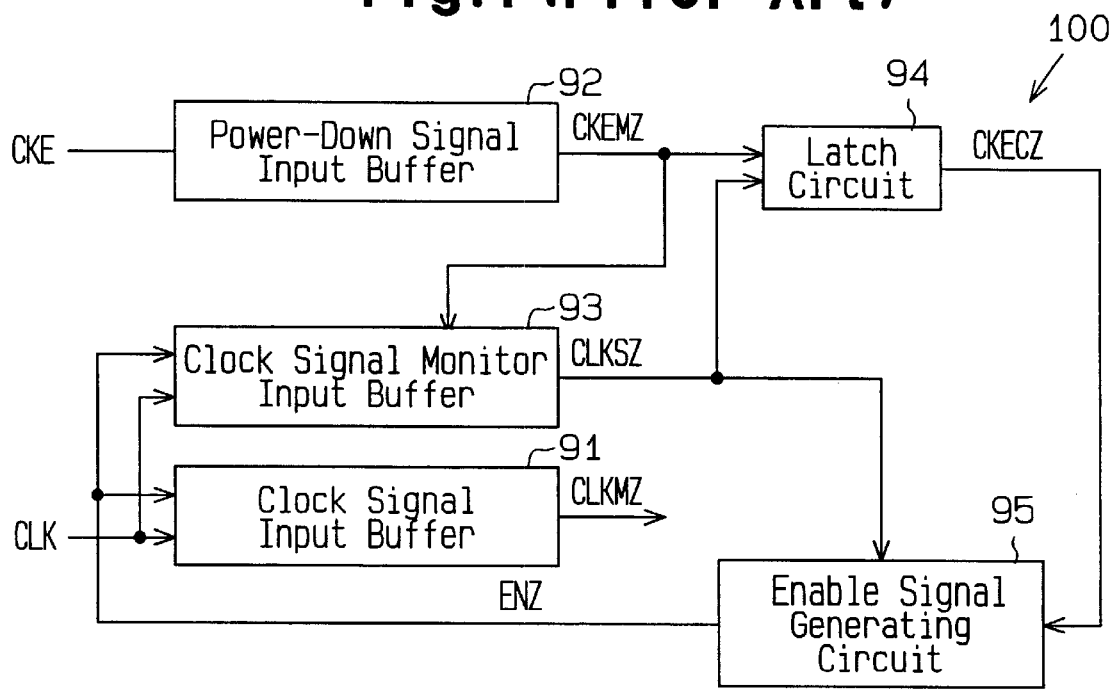
FIG. 1 is a schematic block diagram showing a conventional internal clock signal generating circuit.
Figure 2:
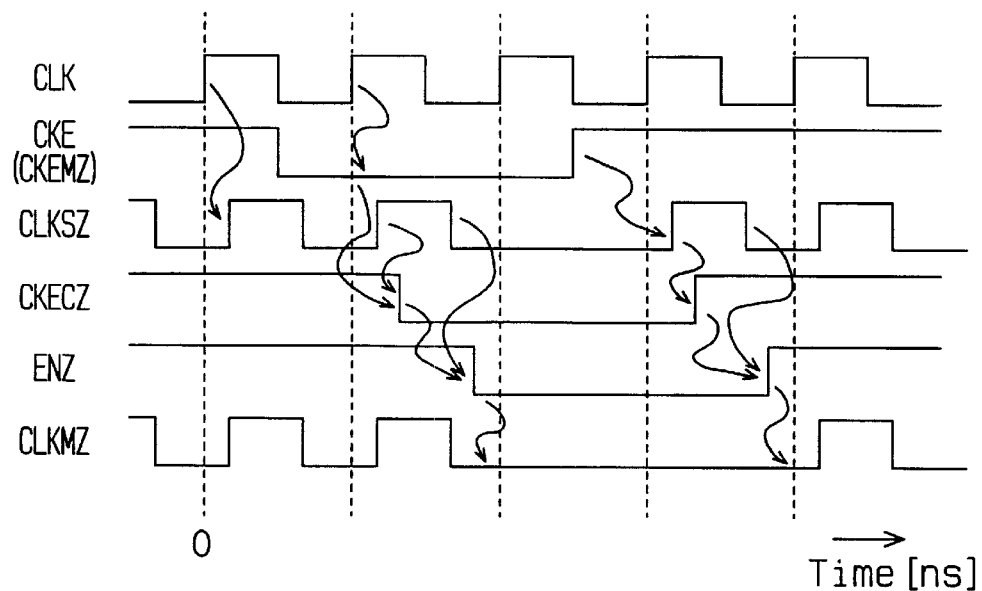
FIG. 2 is a timing chart showing the operation of the internal clock signal generating circuit of FIG. 1.

In the drawings, like numerals are used for like elements throughout.

First Embodiment

Figure 3:
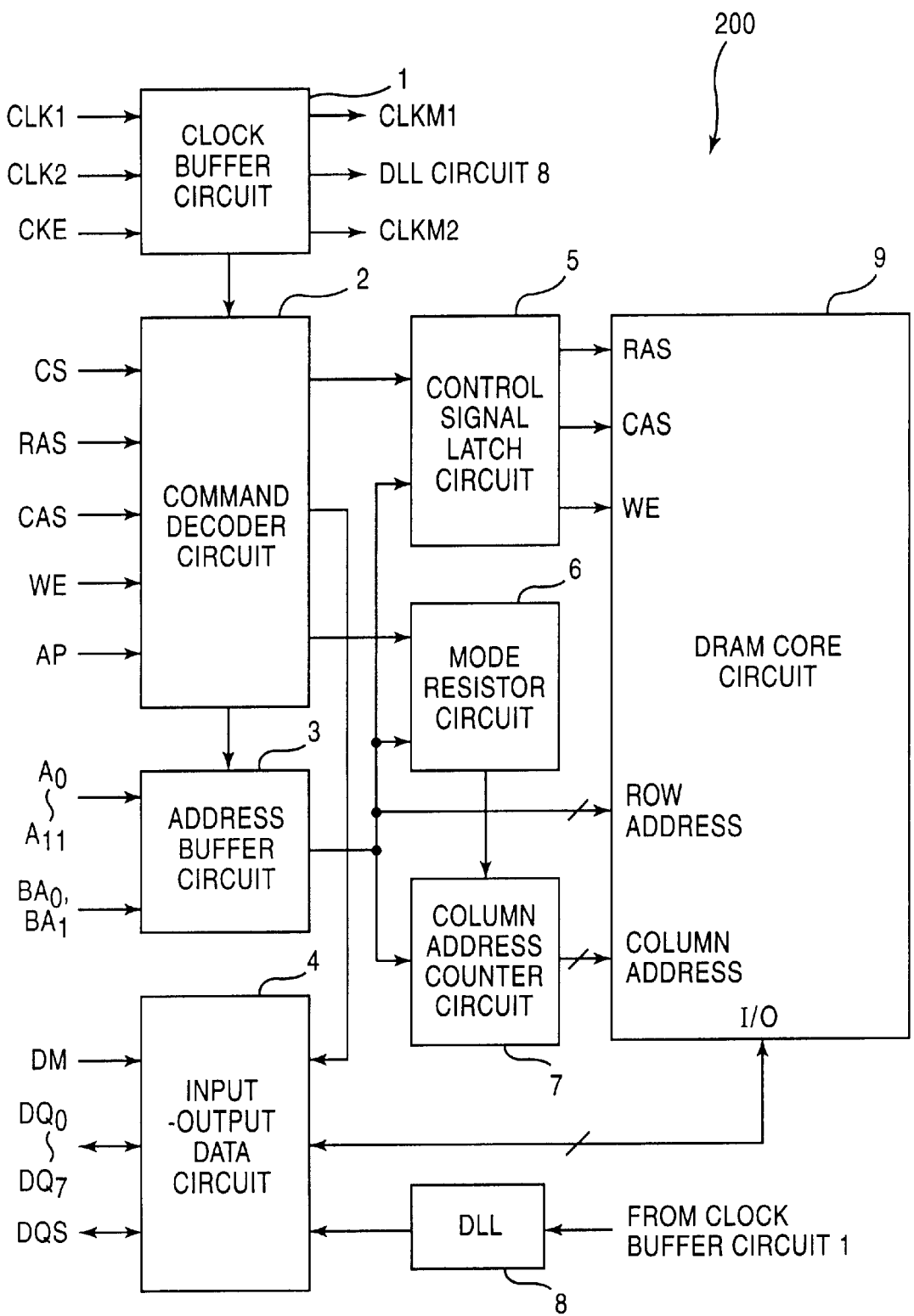
FIG. 3 is a schematic block diagram showing a DDR-SDRAM according to a first embodiment of the present invention.

FIG. 3 is a schematic block showing a DDR-SDRAM 200 employed in a first embodiment according to the present invention. The DDR-SDRAM 200 includes a clock buffer circuit 1, a command decoder circuit 2, an address buffer circuit 3, an input-output data circuit 4, a control signal latch circuit 5, a mode resistor circuit 6, a column address counter circuit 7, a delay locked loop (DLL) circuit 8, and a DRAM core circuit 9.

The clock buffer circuit 1 receives an external power-down signal CKE and first and second external clock signals CLK1, CLK2, which phases differ from each other by 180°, from an external device (not shown). When the external power-down signal CKE is high (non-power-down state), the clock buffer circuit 1 outputs first and second internal clock signals CLKM1, CLKM2, the phases of which are substantially the same as the first and second external clock signals CLK1, CLK2, respectively. When the external power-down signal CKE is low (power-down state), the clock buffer circuit 1 inhibits the output of the first and second internal clock signals CLKM1, CLKM2. The external power-down signal CKE and the first and second internal clock signals CLKM1, CLKM2 are sent to the command decoder circuit 2 and the DLL circuit 8.

The command decoder circuit 2 receives an external command COM, which includes a column address strobe signal CAS, a write enable signal WE, a chip select signal CS, a row address strobe signal RAS, and an auto precharge enable signal AP from the external device in accordance with the first and second internal clock signals CLKM1, CLKM2. The command decoder circuit 2 decodes the external command COM based on the status (high or low) of each of the signals CAS, WE, CS, RAS, AP and in accordance with the external power-down signal CKE and the first and second clock signals CLKM1, CLKM2 to generate commands, such as a write command, a read command, and a refresh command. The command decoder circuit 2 sends the decoded commands, as an internal command and an enable signal, to the address buffer circuit 3, the input-output data circuit 4, the control signal latch circuit 5, and the mode resistor circuit 6.

The address buffer circuit 3 receives address signals $A_0$–$A_{11}$ and bank addresses $BA_0$–$BA_1$ from the external device in accordance with the internal command, which is sent from the command decoder circuit 2. Further, the address buffer circuit 3 sends address data derived from the address signals $A_0$–$A_{11}$ and the bank addresses $BA_0$–$BA_1$ to the control signal latch circuit 5, the mode resistor circuit 6, and the column address counter circuit 7. The address buffer circuit 3 also sends row address data derived from the address signals $A_0$–$A_{11}$ to the DRAM core circuit 9.

The input-output data circuit 4 is activated by the enable signal from the command decoder circuit 2 and receives a data strobe signal DQS, write data $DQ_0$–$DQ_7$, and a data mask signal DM from the external device. The input-output data circuit 4 latches the write data $DQ_0$–$DQ_7$ in response to the rising and falling of the data strobe signal DQS and sends the latched write data $DQ_0$–$DQ_7$ to the DRAM core circuit 9. Furthermore, the input-output data circuit 4 sends the read data $DQ_0$–$DQ_7$ from the DRAM core circuit 9 to the external device in accordance with the internal command from the command decoder circuit 2.

The control signal latch circuit 5 receives the internal command from the command decoder circuit 2 and the address data from the address buffer circuit 3, writes the write data of the DRAM core circuit 9 in accordance with the internal command and the address data, reads the read data, and provides control signals for performing operations, such as refreshing and self-refreshing.

The mode resistor circuit 6 receives the internal command from the command decoder circuit 2 and the address data from the address buffer circuit 3 and maintains the processing mode of the DRAM core circuit 9 in accordance with the internal command and the address data.

The column address counter circuit 7 receives the column address data, which is derived from the address signals $A_0$–$A_{11}$, from the address buffer circuit 3 and sends the column address data to the DRAM core circuit 9 in accordance with the mode maintained by the mode resistor circuit 6.

The DLL circuit 8 receives the first and second internal clock signals CLKM1, CLKM2 from the clock buffer circuit 1 and generates clock signals having different frequencies. The clock signals are sent to the input-output data circuit 4.

The DRAM core circuit 9 receives the row address data from the address buffer circuit 3, control signals from the control signal latch circuit 5, and the column address data from the column address counter circuit 7. The DRAM core circuit 9 writes the write data on a memory cell array in accordance with the control signals and the address data, reads the read data, and performs processes such as refreshing and self-refreshing. That is, the DRAM core circuit 9 writes the write data $DQ_0$–$DQ_7$ on a memory cell at predetermined addresses in accordance with the control signals and the address data.

Figure 4:
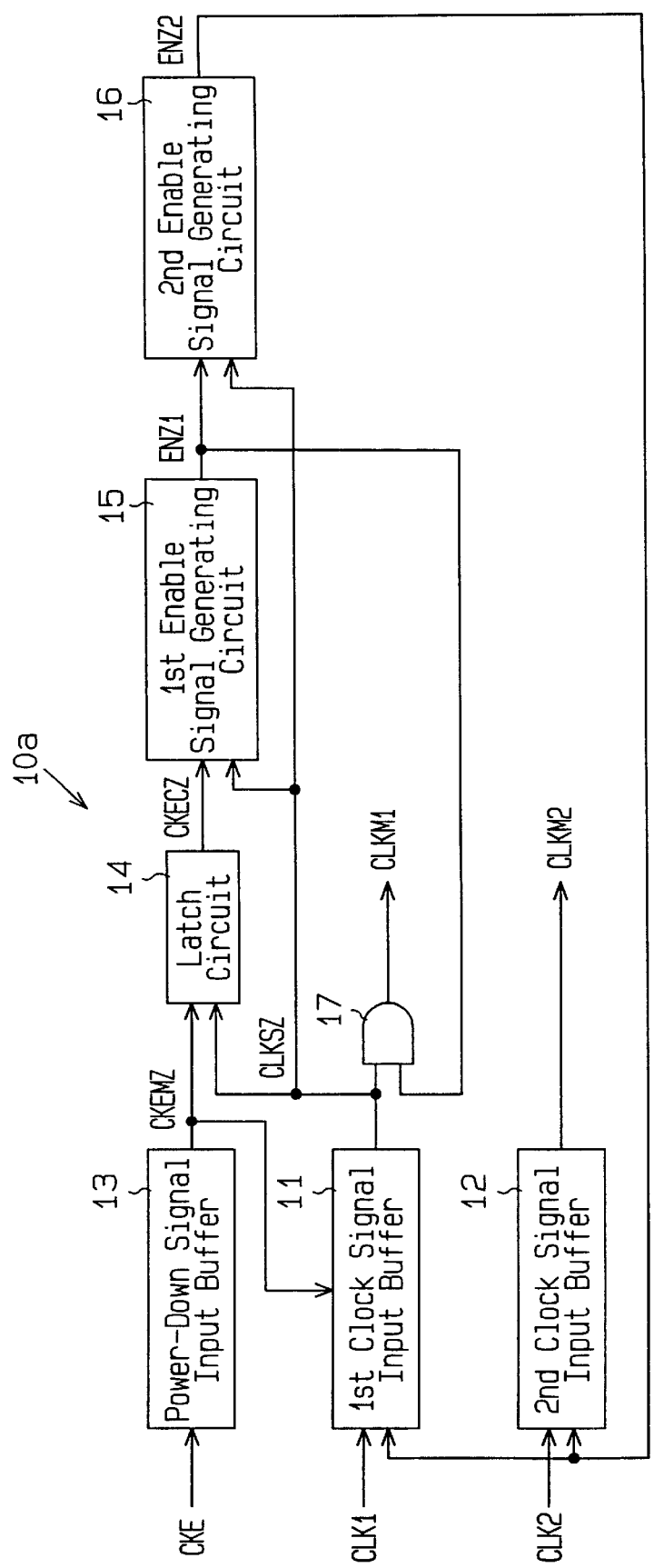
FIG. 4 is a schematic block diagram showing an internal clock signal generating circuit of the DDR-SDRAM of FIG. 3.

FIG. 4 is a schematic block diagram showing an internal clock signal generating circuit 10a, which is incorporated in the clock buffer circuit 1. The generating circuit 10a generates the first and second internal clock signals CLKM1, CLKM2 from the first and second external clock signals CLK1, CLK2, respectively. The internal clock signal generating circuit 10a includes a first clock signal input buffer 11, a second clock signal input buffer 12, a power-down signal input buffer 13, a latch circuit 14, a first enable signal generating circuit 15, a second enable signal generating circuit 16, and a first gate circuit 17. The first and second clock signal input buffers 11, 12 function as clock signal input circuits. The power-down signal input buffer 13 functions as an external control signal input circuit. Furthermore, the latch circuit 14, the first enable signal generating circuit 15, the second enable signal generating circuit 16, and the first gate circuit 17 function as output control circuits of the first and second internal clock signals.

The first clock signal input buffer 11 receives the first external clock signal CLK1 from the external device and outputs a first clock signal CLKSZ, which phase is substantially the same as the first external clock signal CLK1. Furthermore, the first clock signal input buffer 11 is activated when either a main-power down signal CKEMZ, which is sent from the power-down signal input buffer 13, or a second enable signal ENZ2, which is sent from the second enable signal generating circuit 16, is high. The first clock signal input buffer 11 is deactivated when the main power-down signal CKEMZ and the second enable signal ENZ2 are both low.

Figure 5:
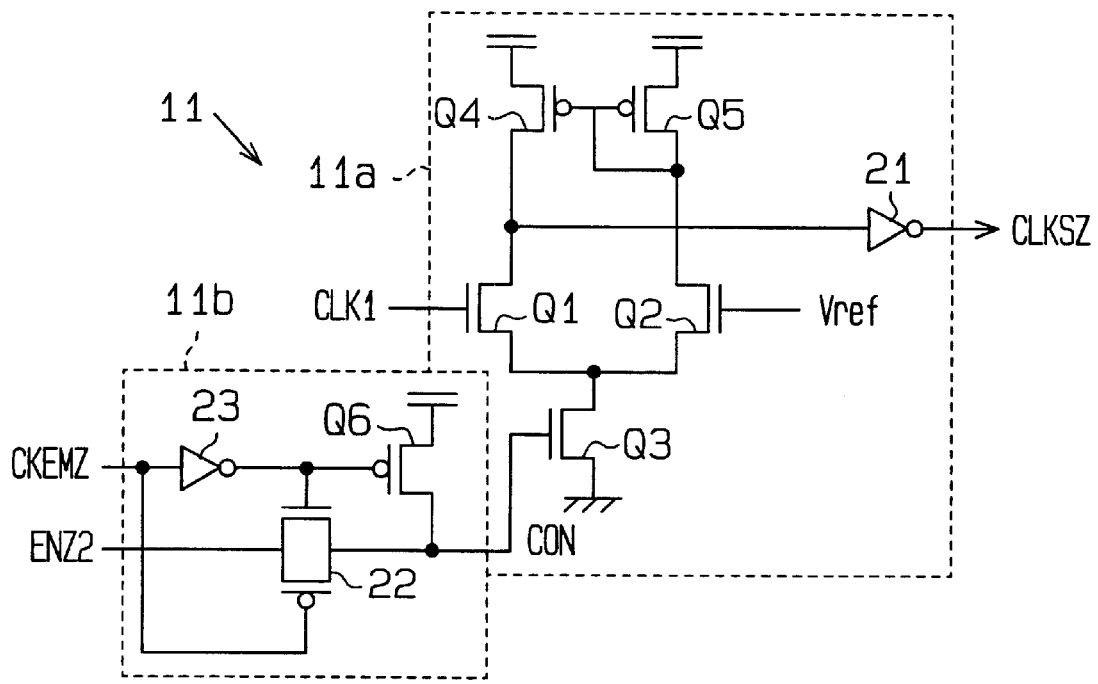
FIG. 5 is a circuit diagram showing a first clock signal input buffer of the internal clock signal generating circuit of FIG. 4.

FIG. 5 is a circuit diagram showing the first clock signal input buffer 11, which includes a differential amplifying circuit 11a and a control circuit 11b. The differential amplifying circuit 11a is a current mirror type circuit and is provided with a differential amplifying portion having n-channel MOS (NMOS) transistors Q1, Q2, a constant current portion having an NMOS transistor Q3, and a current mirror portion having p-channel MOS (PMOS) transistors Q4, Q5.

The sources of the NMOS transistors Q1, Q2 are grounded by way of the NMOS transistor Q3. The drain of the NMOS transistor Q1 is connected to a high potential power supply by way of the PMOS transistor Q4. The drain of the NMOS transistor Q2 is connected to a high potential power supply by way of the PMOS transistor Q5. The gates of the transistors Q4, Q5 are connected together and to the drain of the NMOS transistor Q2. The drain of the NMOS transistor Q1 is connected to an inverter circuit 21. The gate of the NMOS transistor Q1 is provided with the first external clock signal CLK1. The gate of the NMOS transistor Q2 is provided with a reference voltage Vref. The gate of the NMOS transistor Q3 is provided with a control signal CON, which is generated by the control circuit 11b.

The control circuit 11b includes a transfer gate 22 having a PMOS transistor and an NMOS transistor, a PMOS transistor Q6, and an inverter circuit 23. The PMOS transistor gate of the transfer gate 22 is provided with the main power-down signal CKEMZ, while the NMOS transistor gate of the transfer gate 22 is provided with the main power-down signal CKEMZ by way of the inverter circuit 23. If the main power-down signal CKEMZ is low, the transfer gate 22 goes ON and provides the second enable signal ENZ2 as the control signal CON to the gate of the NMOS transistor Q3. When the main power-down signal CKEMZ is high, the transfer gate 22 goes OFF.

The source of the PMOS transistor Q6 is connected to a high potential power supply and the drain of the PMOS transistor Q6 is connected to the gate of the NMOS transistor Q3. The gate of the PMOS transistor Q6 is provided with the main power-down signal CKEMZ by way of the inverter circuit 23. Thus, if the main power-down signal CKEMZ is high, the PMOS transistor Q6 goes ON and sends a high control signal CON to the gate of the NMOS transistor Q3. That is, if either the main power-down signal CKEMZ or the second enable signal ENZ2 is high, the control circuit 11b sends a high control signal CON to the gate of the NMOS transistor Q3. This causes the NMOS transistor Q3 to go ON and activates the differential amplifying circuit 11a.

If the main power-down signal CKEMZ and the second enable signal ENZ2 are both low, the control circuit 11b provides a low control signal CON to the gate of the NMOS transistor Q3. This causes the NMOS transistor Q3 to go OFF and deactivates the differential amplifying circuit 11a.

Accordingly, when the differential amplifying circuit 11a is activated, the differential amplifying circuit 11a outputs the internal clock signal CLKSZ (first internal clock signal CLKM1) in accordance with the first external clock signal CLK1. On the other hand, when the differential amplifying circuit 11a is deactivated, the differential amplifying circuit 11a stops, or inhibits, the output of the internal clock signal CLKSZ (the first internal clock signal CLKM1) even if the first external clock signal CLK1 is being input.

As shown in FIG. 4, the second clock signal input buffer 12 receives the second external clock signal CLK2 from the external device and outputs the second internal clock signal CLKM2, which phase is substantially the same as the second external clock signal CLK2. Furthermore, the second clock signal input buffer 12 receives the second enable signal ENZ2. The input buffer 12 is activated when the second enable signal ENZ2 is high and deactivated when the second enable signal ENZ2 is low.

Figure 6:
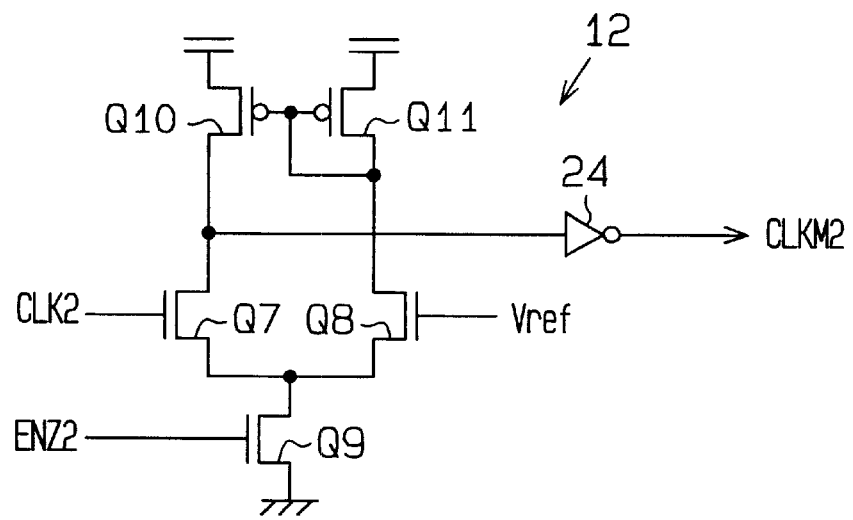
FIG. 6 is a circuit diagram showing a second clock signal input buffer of the internal clock signal generating circuit of FIG. 4.

FIG. 6 is a circuit diagram showing the second clock signal input buffer 12. The second clock signal input buffer 12, which is a current mirror type differential amplifying circuit, includes a differential amplifying portion having NMOS transistors Q7, Q8, a constant current portion having an NMOS transistor Q9, and a current mirror portion having PMOS transistors Q10, Q11.

The sources of the NMOS transistors Q7, Q8 are grounded by way of the NMOS transistor Q9. The drain of the NMOS transistor Q7 is connected to a high potential power supply by way of the PMOS transistor Q10. The drain of the NMOS transistor Q8 is connected to a high potential power supply by way of the PMOS transistor Q11. The gates of the PMOS transistors Q10, Q11 are connected together and to the drain of the NMOS transistor Q8. The drain of the NMOS transistor Q7 is connected to the input of the inverter circuit 24. The gate of the NMOS transistor Q7 is provided with the second external clock signal CLK2. The gate of the NMOS transistor Q8 is provided with a reference voltage Vref. The gate of the NMOS transistor Q9 is provided with the second enable signal ENZ2.

If the second enable signal ENZ2 is high, the NMOS transistor Q9 goes ON and activates the second clock signal input buffer 12. If the second enable signal ENZ2 is low, the NMOS transistor Q9 goes OFF and deactivates the second clock signal input buffer 12. When the second clock signal input buffer 12 is activated, it outputs the second internal clock signal CLKM2 in accordance with the second external clock signal CLK2. On the other hand, when the second clock signal input buffer 12 is deactivated, it stops, or inhibits, the output of the second internal clock signal CLKM2 even if the second external clock signal CLK2 is being input.

As shown in FIG. 4, the power-down signal input buffer 13, which functions as an external control signal input circuit, receives the external power-down signal CKE and outputs a main power-down signal CKEMZ, which phase is substantially the same as the external power-down signal CKE. The buffer 13 outputs a high main power-down signal CKEMZ if the external power-down signal CKE is high and outputs a low main power down signal CKEMZ if the external power-down signal CKE is low.

The first clock signal input buffer 11 is activated by a high main power-down signal CKEMZ and deactivated when the main power-down signal CKEMZ and the second enable signal ENZ2 are both low.

The latch circuit 14, which functions as an internal clock signal output circuit, receives the main power-down signal CKEMZ and the internal clock signal CLKSZ, which is sent from the first clock signal input buffer 11. When the internal clock signal CLKSZ goes high, the latch circuit 14 latches the main power-down signal CKEMZ (in a high level or a low level). The latched main power-down signal CKEMZ is output from the latch circuit 14 as the internal power-down signal CKECZ.

Figure 7:
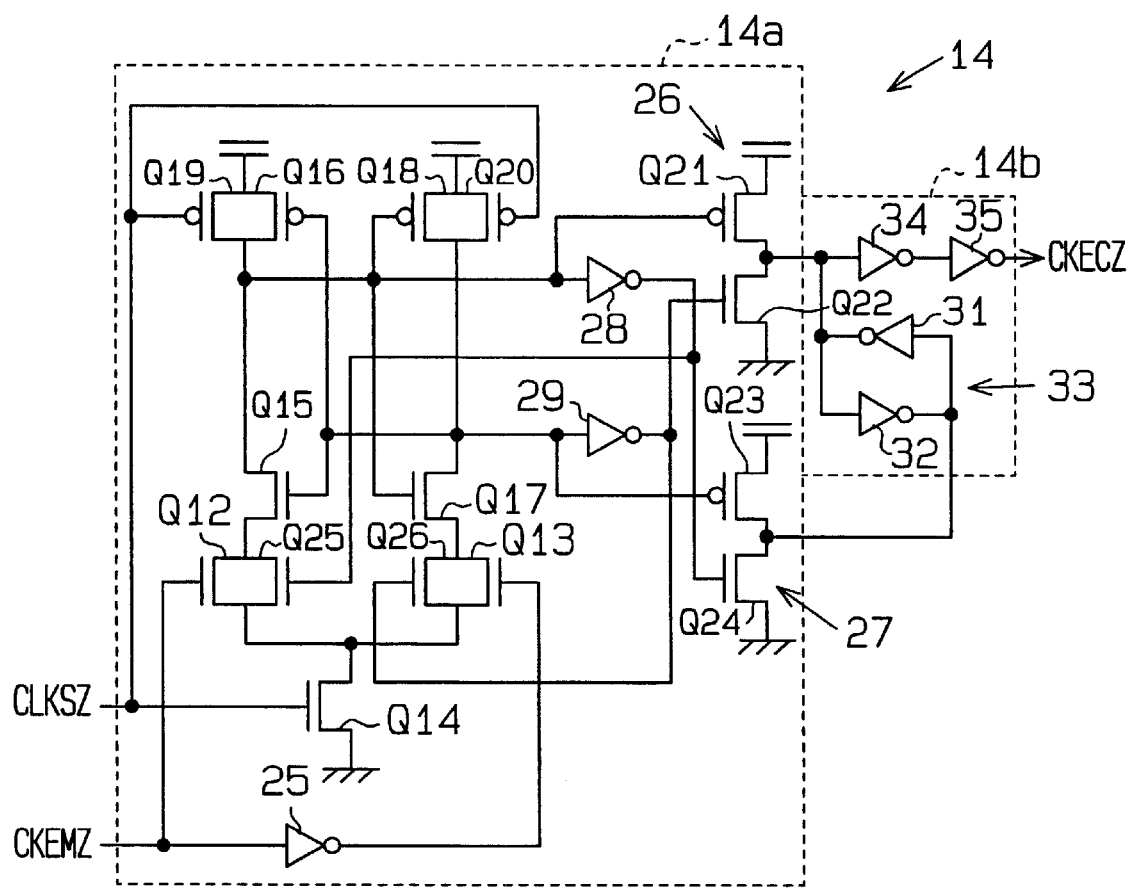
FIG. 7 is a circuit diagram showing a latch circuit of the internal clock signal generating circuit of FIG. 4.

FIG. 7 is a circuit diagram showing the latch circuit 14, which includes a judgement circuit 14a and a latch circuit 14b. The latch circuit 14 outputs a high internal power-down signal CKECZ if the internal clock signal CLKSZ goes high when the main power-down signal CKEMZ is high. Further, the latch circuit 14 outputs a low internal power-down signal CKECZ if the internal clock signal CLKSZ goes high when the main power-down signal CKEMZ is low.

The judgement circuit 14a includes an amplifying portion having NMOS transistors Q12, Q13, a constant current portion having an NMOS transistor Q14, a first output circuit 26 having a PMOS transistor Q21 and an NMOS transistor Q22, and a second output circuit 27 having a PMOS transistor Q23 and an NMOS transistor Q24.

The sources of the NMOS transistors Q12, Q13 are grounded by way of the NMOS transistor Q14. The drain of the NMOS transistor Q12 is connected to a high potential power supply by way of an NMOS transistor Q15 and a PMOS transistor Q16. The gates of the transistors Q15, Q16 are connected to each other. The drain of the NMOS transistor Q13 is connected to a high potential power supply by way of an NMOS transistor Q17 and a PMOS transistor Q18. The gates of the transistors Q17, Q18 are connected to each other. The PMOS transistors Q16, Q18 are each connected in parallel to PMOS transistors Q19, Q20, respectively.

The gates of the NMOS transistor Q14 and the PMOS transistors Q19, Q20 are provided with the internal clock signal CLKSZ. The gate of the NMOS transistor Q12 is provided with the main power-down signal CKEMZ. The gate of the NMOS transistor Q13 is also provided with the main power-down signal CKEMZ by way of an inverter circuit 25.

The drain of the NMOS transistor Q15 is connected to the gate of the PMOS transistor Q21 in the first output circuit 26 and to the gate of the NMOS transistor Q24 in the second output circuit 27 by way of an inverter circuit 28. The drain of the NMOS transistor Q15 is also connected to the gates of the NMOS transistor Q17 and the PMOS transistor Q18.

The drain of the NMOS transistor Q17 is connected to the gate of the PMOS transistor Q23 in the second output circuit 27 and to the gate of the NMOS transistor Q22 in the first output circuit 26 by way of an inverter circuit 29. The drain of the NMOS transistor Q17 is also connected to the gates of the NMOS transistor Q15 and the PMOS transistor Q16.

The NMOS transistors Q12, Q13 are connected in series to the NMOS transistors Q25, Q26, respectively. The gate of the NMOS transistor Q25 is provided with the output signal of the inverter circuit 28, and the gate of the NMOS transistor Q26 is provided with the output signal of an inverter circuit 29.

In the judgement circuit 14a, the NMOS transistor Q14 goes ON when the internal clock signal CLKSZ is high. The NMOS transistor Q12 goes ON and the NMOS transistor Q13 goes OFF when the main power-down signal CKEMZ (the external power-down signal CKE) is high. In this state, the potential at the drain of the NMOS transistor Q15 goes low and the potential at the drain of the NMOS transistor Q17 goes high. Thus, the PMOS transistor Q21 goes ON, the NMOS transistor Q22 goes OFF, and the first output circuit 26 outputs a high signal. Furthermore, the PMOS transistor Q23 goes OFF, the NMOS transistor Q24 goes ON, and the second output circuit 27 outputs a low signal. In this state, a high output signal from the inverter circuit 28 causes the NMOS transistor Q25 to go ON, and a low output signal from the inverter circuit 29 causes the NMOS transistor Q26 to go OFF. In addition, the PMOS transistor Q16 goes OFF, the NMOS transistor Q15 goes ON, the PMOS transistor Q18 goes ON, and the NMOS transistor Q17 goes OFF.

If the internal clock signal CLKSZ goes low in this state, the NMOS transistor Q14 goes OFF, the PMOS transistors Q19, Q20 go ON, and the drains of the NMOS transistors Q15, Q17 are both set at a high level. As a result, the transistors Q21–Q24 go OFF and the first and second output circuits 26, 27 are set to a high impedance state.

Afterward, if the internal clock signal CLKSZ goes high, the drain of the NMOS transistor Q15 goes low and the drain of the NMOS transistor Q17 remains high. Thus, the first output circuit 26 outputs a high signal and the second output circuit 27 outputs a low signal. In other words, if the main power-down signal CKEMZ (external power-down signal CKE) is high, the first output circuit 26 outputs a high signal and the second output circuit 27 outputs a low signal each time the internal clock signal CLKSZ goes high. Furthermore, the first and second output circuits 26, 27 are set at high impedance states each time the internal clock signal CLKSZ goes low.

When the main power-down signal CKEMZ (external power-down signal CKE) is low, the drain of the NMOS transistor Q17 goes low and the drain of the NMOS transistor Q15 remains high each time the internal clock signal CLKSZ goes high. Thus, the first output circuit 26 outputs a low signal and the second output circuit 27 outputs a high signal.

In this state, if the internal clock signal CLKSZ goes low, the drains of the NMOS transistor Q15 and the NMOS transistor Q17 are both set to a high level, the transistors Q21–Q24 go OFF, and the first and second output circuits 26, 27 are set to a high impedance state.

The latch circuit 14b includes a latch circuit 33, which is formed by inverter circuits 31, 32, and two inverter circuits 34, 35. The output terminal of the latch circuit 33 is connected to the output terminal of the first output circuit 26. The input terminal of the latch circuit 33 is connected to the output terminal of the second output circuit 27. Accordingly, the latch circuit 33 latches the signals output from the first and second output circuits 26, 27 each time the internal clock signal CLKSZ goes high. In other words, if the main power-down signal CKEMZ (the external power-down signal CKE) is high, the latch circuit 33 latches the high signal. If the main power-down signal CKEMZ (the external power-down signal CKE) is low, the latch circuit 33 latches the low signal. The latch signal of the latch circuit 33, or the main power-down signal CKEMZ (external power-down signal CKE), is output through the inverter circuits 34, 35, which are connected in series, as the internal power-down signal CKECZ.

As shown in FIG. 4, the first enable signal generating circuit 15 receives the internal power-down signal CKECZ from the latch circuit 14 and the internal clock signal CLKSZ from the first clock signal input buffer 11, holds the (high or low) internal power-down signal CKECZ in response to the rising of the internal clock signal CLKSZ, and provides the held internal power-down signal CKECZ to the second enable signal generating circuit 16 as the first enable signal ENZ1.

Figure 8:
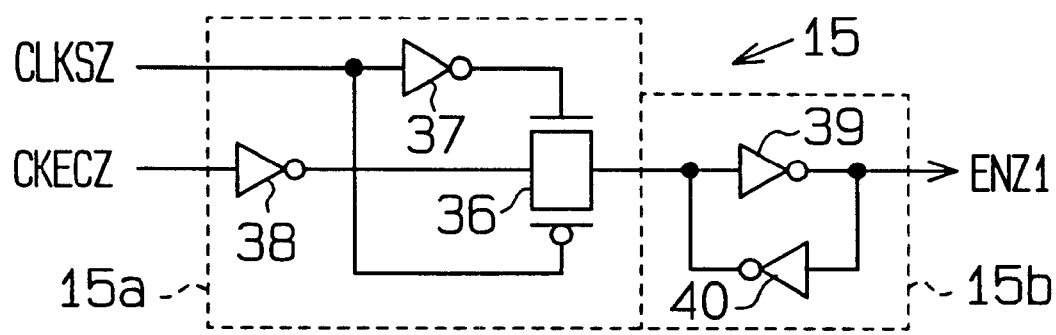
FIG. 8 is a circuit diagram showing a first enable signal generating circuit of the internal clock signal generating circuit of FIG. 4.

FIG. 8 is a circuit diagram showing the first enable signal generating circuit 15, which includes a control circuit 15a and a latch circuit 15b. The control circuit 15a is provided with a transfer gate 36 having a PMOS transistor and an NMOS transistor and two inverter circuits 37, 38.

The PMOS transistor gate of the transfer gate 36 receives the internal clock signal CLKSZ. The NMOS transistor gate of the transfer gate 36 receives the internal clock signal CLKSZ by way of the inverter circuit 37. When the internal clock signal CLKSZ is low, the transfer gate 36 goes ON and the internal power-down signal CKECZ is sent to the latch circuit 15b through the inverter circuit 38 and the transfer gate 36. When the internal clock signal CLKSZ is high, the transfer gate 36 goes OFF and the internal power-down signal CKECZ is not provided to the latch circuit 15b.

The latch circuit 15b includes inverter circuits 39, 40. The input terminal of the latch circuit 15b is connected to the output terminal of the transfer gate 36. The latch circuit 15b latches the internal power-down signal CKECZ each time the internal clock signal CLKSZ goes high and outputs the latched internal power-down signal CKECZ as the first enable signal ENZ1. In other words, when the internal power-down signal CKECZ (the external power-down signal CKE) is high, the latch circuit 15b outputs a high first enable signal ENZ1. If the internal power-down signal CKECZ (the external power-down signal CKE) is low, the latch circuit 15b outputs a low first enable signal ENZ1.

As shown in FIG. 4, the second enable signal generating circuit 16 receives the first enable signal ENZ1 from the first enable signal generating circuit 15 and the internal clock signal CLKSZ from the first clock signal input buffer 11, holds the first enable signal ENZ1 in response to the rising of the internal clock signal CLKSZ, and outputs the held first enable signal ENZ1 as the second enable signal ENZ2.

Figure 9:
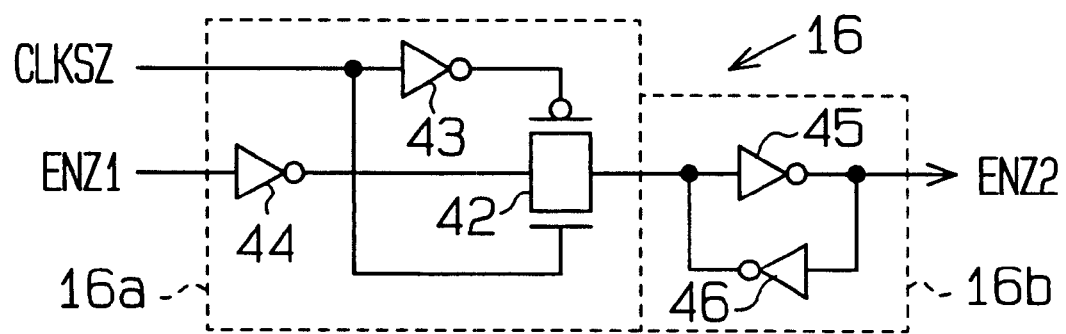
FIG. 9 is a circuit diagram showing a second enable signal generating circuit of the internal clock signal generating circuit of FIG. 4.

FIG. 9 is a circuit diagram showing the second enable signal generating circuit 16, which includes a control circuit 16a and a latch circuit 16b. The control circuit 16a is provided with a transfer gate 42 having a PMOS transistor and an NMOS transistor and two inverter circuits 43, 44.

The NMOS transistor gate of the transfer gate 42 receives the internal clock signal CLKSZ. The PMOS transistor gate of the transfer gate 42 receives the internal clock signal CLKSZ by way of the inverter circuit 43. When the internal clock signal CLKSZ is high, the transfer gate 42 goes ON and the first enable signal ENZ1 is sent to the latch circuit 16b through the inverter circuit 44 and the transfer gate 42. When the internal clock signal CLKSZ is low, the transfer gate 42 goes OFF and the first enable signal ENZ1 is not provided to the latch circuit 16b.

The latch circuit 16b includes inverter circuits 45, 46. The input terminal of the latch circuit 16b is connected to the output terminal of the transfer gate 42. The latch circuit 16b latches the first enable signal ENZ1 each time the internal clock signal CLKSZ goes low and outputs the latched first enable signal ENZ1 as the second enable signal ENZ2. In other words, when the first enable signal ENZ1 (the internal power-down signal CKECZ) is high, the latch circuit 16b outputs a high second enable signal ENZ2. If the first enable signal ENZ1 (the internal power-down signal CKECZ) is low, the latch circuit 16b outputs a low second enable signal ENZ2.

As shown in FIG. 4, the first gate circuit 17, which is preferably a two input AND circuit, receives the internal clock signal CLKSZ from the first clock signal input buffer 11 and the first enable signal ENZ1 from the first enable signal generating circuit 15, and outputs the internal clock signal CLKSZ as the first internal clock signal CLKM1 when the first enable signal ENZ1 is high. Furthermore, the first gate circuit 17 does not output the internal clock signal CLKSZ when the first enable signal ENZ1 is low.

The operation of the internal clock signal generating circuit 10a will now be described.

The power-down signal input buffer 13 receives a high external power-down signal CKE and outputs a high main power-down signal CKEMZ. The first clock signal input buffer 11 is activated by the high main power-down signal CKEMZ and provides the first external clock signal CLK1 as the internal clock signal CLKSZ to the latch circuit 14, the first enable signal generating circuit 15, the second enable signal generating circuit 16, and the first gate circuit 17.

The latch circuit 14 outputs a high internal power-down signal CKECZ. The first enable signal generating circuit 15 outputs a high first enable signal ENZ1. The second enable signal generating circuit 16 outputs a high second enable signal ENZ2. Thus, the first gate circuit 17 outputs the internal clock signal CLKSZ as the first internal clock signal CLKM1. The second clock signal input buffer 12 is activated when the second enable signal ENZ2 goes high and outputs the second external clock signal CLK2 as the second internal clock signal CLKM2.

When the external power-down signal CKE goes low, the power-down signal input buffer 13 outputs a low main power-down signal CKEMZ. Despite the falling of the main power-down signal CKEMZ, the high second enable signal ENZ2 keeps the first clock signal input buffer 11 in an activated state. Thus, the first clock signal CLK1 is continuously output as the internal clock signal CLKSZ by the first clock signal input buffer 11.

After the main power-down signal CKEMZ goes low, the latch circuit 14 latches the low main power-down signal CKEMZ in response to the rising of the internal clock signal CLKSZ and provides the first enable signal generating circuit 15 with a low internal power-down signal CKECZ.

When the internal clock signal CLKSZ falls after the latch circuit 14 latches the low main power-down signal CKEMZ, the first enable signal generating circuit 15 latches the low internal power-down signal CKECZ and provides the second enable signal generating circuit 16 and the first gate circuit 17 with a low first enable signal ENZ1.

Figure 10:
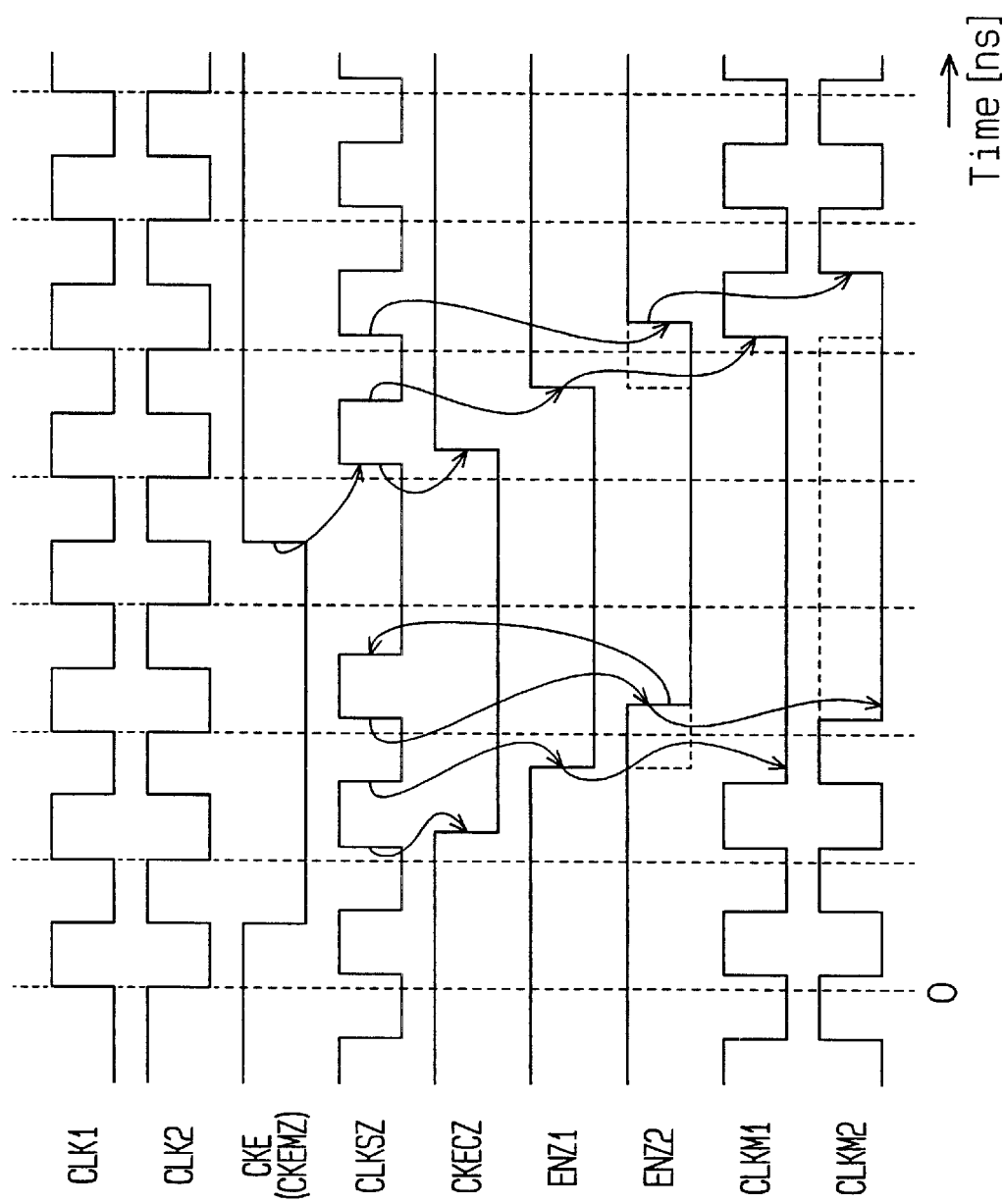
FIG. 10 is a timing chart showing the operation of the internal clock signal generating circuit of FIG. 4.

The first gate circuit 17 invalidates the first internal clock signal CLKM1 in response to the low first enable signal ENZ1. That is, as shown in FIG. 10, the falling of the internal clock signal CLKSZ after the latching of the low main power-down signal CKEMZ invalidates the first internal clock signal CLKM1.

When the internal clock signal CLKSZ rises after the first enable signal generating circuit 15 latches the low internal power-down signal CKECZ, the second enable signal generating circuit 16 latches the low first enable signal ENZ1 and provides the first and second clock signal input buffers 11, 12 with a low second enable signal ENZ2.

The low second enable signal ENZ2 deactivates the first clock signal input buffer 11 and invalidates the internal clock signal CLKSZ. Furthermore, the low second enable signal ENZ2 deactivates the second clock signal input buffer 12 and invalidates the second internal clock signal CLKM2. That is, as shown in FIG. 10, the rising of the internal clock signal CLKSZ subsequent to its falling after latching of the low main power-down signal CKEMZ invalidates the second internal clock signal CLKM2. In other words, the second internal clock signal CLKM2 is invalidated when half a cycle of the internal clock signal CLKSZ (the first internal clock signal CLKM1) elapses subsequent to the invalidation of the first internal clock signal CLKM1.

When the external power-down signal CKE rises again subsequent to the invalidation of the first and second internal clock signals CLKM1, CLKM2, the power-down signal input buffer 13 outputs a high main power-down signal CKEMZ. The high main power-down signal CKEMZ activates the first clock signal input buffer 11 and provides the latch circuit 14, the first enable signal generating circuit 15, the second enable signal generating circuit 16, and the first gate circuit 17 with the internal clock signal CLKSZ.

The latch circuit 14 outputs a high power-down signal CKECZ. The first enable signal generating circuit 15 outputs a high first enable signal ENZ1 and the second enable signal generating circuit 16 outputs a high second enable signal ENZ2.

After the main power-down signal CKEMZ goes high, the latch circuit 14 latches the high main power-down signal CKEMZ in response to the first rising of the internal clock signal CLKSZ and provides the first enable signal generating circuit 15 with a high internal power-down signal CKECZ.

When the internal clock signal CLKSZ falls after the latch circuit 14 latches the high main power-down signal CKEMZ, the first enable signal generating circuit 15 latches the high internal power-down signal CKECZ and provides the second enable signal generating circuit 16 and the first gate circuit 17 with a high first enable signal ENZ1.

The first gate circuit 17 outputs the first internal clock signal CLKM1 in response to the high first enable signal ENZ1. That is, the falling of the internal clock signal CLKSZ after the latching of the low main power-down signal CKEMZ validates the first internal clock signal CLKM1.

When the internal clock signal CLKSZ rises after the first enable signal generating circuit 15 latches the high internal power-down signal CKECZ, the second enable signal generating circuit 16 latches the high first enable signal ENZ1 and provides the first and second clock signal input buffers 11, 12 with a high second enable signal ENZ2.

The high second enable signal ENZ2 activates the second clock signal input buffer 12 and causes the second internal clock signal CLKM2 to be output. That is, the rising of the internal clock signal CLKSZ subsequent to its falling after latching of the high main power-down signal CKEMZ validates the second internal clock signal CLKM2. In other words, the second internal clock signal CLKM2 is validated when half a cycle of the internal clock signal CLKSZ (the first internal clock signal CLKM1) elapses subsequent to the validation of the first internal clock signal CLKM1.

The characteristics of the internal clock signal generating circuit 10a will now be described.

(1) When the external power-down signal CKE (main power-down signal CKEMZ) falls, the first internal clock signal CLKM1 is invalidated half a cycle earlier than the second internal clock signal CLKM2. Furthermore, when the external power-down signal CKE (the main power-down signal CKEMZ) rises, the first internal clock signal CLKM1 is validated half a cycle earlier than the second internal clock signal CLKM2. Accordingly, the internal clock signal generating circuit 10a always validates and invalidates the first and second clock signals CLKM1, CLKM2 with a constant relationship regardless of the timing in which the external power-down signal CKE shifts between a high level and a low level.

(2) The first clock signal input buffer 11 remains activated during the period immediately after the external power-down signal CKE (the main power-down signal CKEMZ) falls. The internal clock signal CLKSZ provided by the first clock signal input buffer 11 then causes the latch circuit 14 to output a low internal power-down signal CKECZ. Furthermore, the first enable signal generating circuit 15 outputs a low first enable signal ENZ1 in response to the falling of the internal clock signal CLKSZ. After half a cycle elapses from the falling of the internal clock signal CLKSZ, the second enable signal generating circuit 16 latches the first enable signal ENZ1 in response to the rising of the internal clock signal CLKSZ and outputs a low second enable signal ENZ2.

Accordingly, the first internal clock signal CLKM1 is always invalidated earlier by half a cycle than the second internal clock signal CLKM2 when the external power-down signal CKE (the main power-down signal CKEMZ) falls.

(3) The first clock signal input buffer 11 is activated immediately after the external power-down signal CKE (main power-down signal CKEMZ) rises. When the internal clock signal CLKSZ provided by the first clock signal input buffer 11 rises, the latch circuit 14 outputs a high internal power-down signal CKECZ. Furthermore, the first enable signal generating circuit 15 outputs a high first enable signal ENZ1 in response to the falling of the internal clock signal CLKSZ. After half a cycle elapses from the falling of the internal clock signal CLKSZ, the second enable signal generating circuit 16 latches the first enable signal ENZ1 in response to the rising of the internal clock signal CLKSZ and outputs a high second enable signal ENZ2.

Accordingly, the first internal clock signal CLKM1 is always validated earlier by half a cycle than the second internal clock signal CLKM2 when the external power-down signal CKE (main power-down signal CKEMZ) rises.

Figure 11:
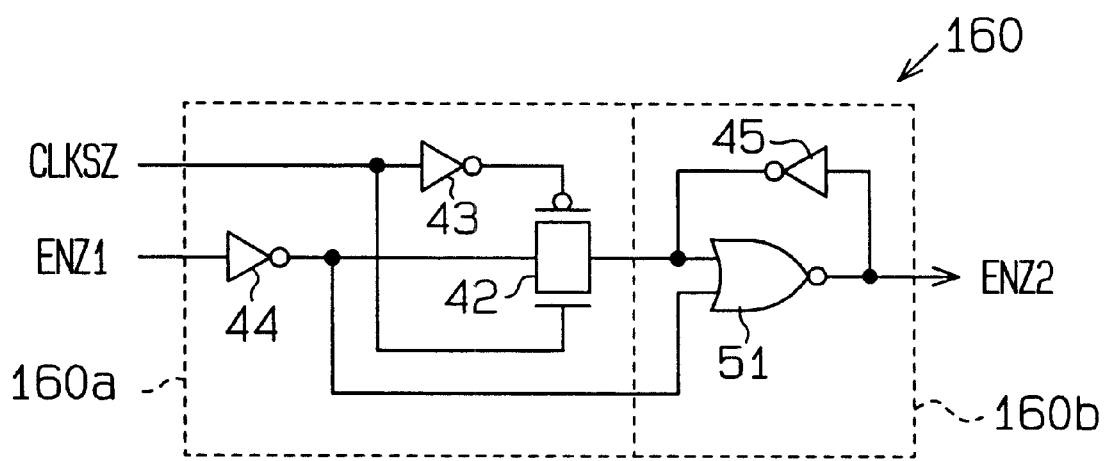
FIG. 11 is a circuit diagram showing a further example of the second enable signal generating circuit of FIG. 9.

FIG. 11 is a circuit diagram showing another second enable signal generating circuit 160, which includes a control circuit 160a and a latch circuit 160b. The latch circuit 160b is provided with a NOR circuit 51 in lieu of the inverter circuit 46 shown in FIG. 9. The NOR circuit 51, which is preferably a two input NOR circuit, has a first input terminal connected to the output terminal of the transfer gate 42 and a second input terminal connected to the output terminal of an inverter circuit 44 of the control circuit 160a. Thus, the signal from the inverter circuit 44 (an inverted first enable signal ENZ1) is sent directly to the second input terminal of the NOR circuit 51 without passing through the transfer gate 42.

The second enable signal generating circuit 160 immediately latches the first enable signal ENZ1, which is sent from the first enable signal generating circuit 15, in response to the falling of the internal clock signal CLKSZ and outputs the second enable signal ENZ2. Thus, as shown in FIG. 10, the shifting of the second enable signal ENZ2, which is output by the second enable signal generating circuit 160, occurs as shown by the dashed lines. This results in the second clock signal CLKM2, which is output by the second clock signal input buffer 12, having a waveform shown by the dashed lines. In other words, the first internal clock signal CLKM1 always rises earlier by half a cycle than the second internal clock signal CLKM2. In this case, the first internal clock signal CLKM1 is invalidated when low, and the second internal clock signal CLKM2 is invalidated when high.

Second Embodiment

Figure 12:
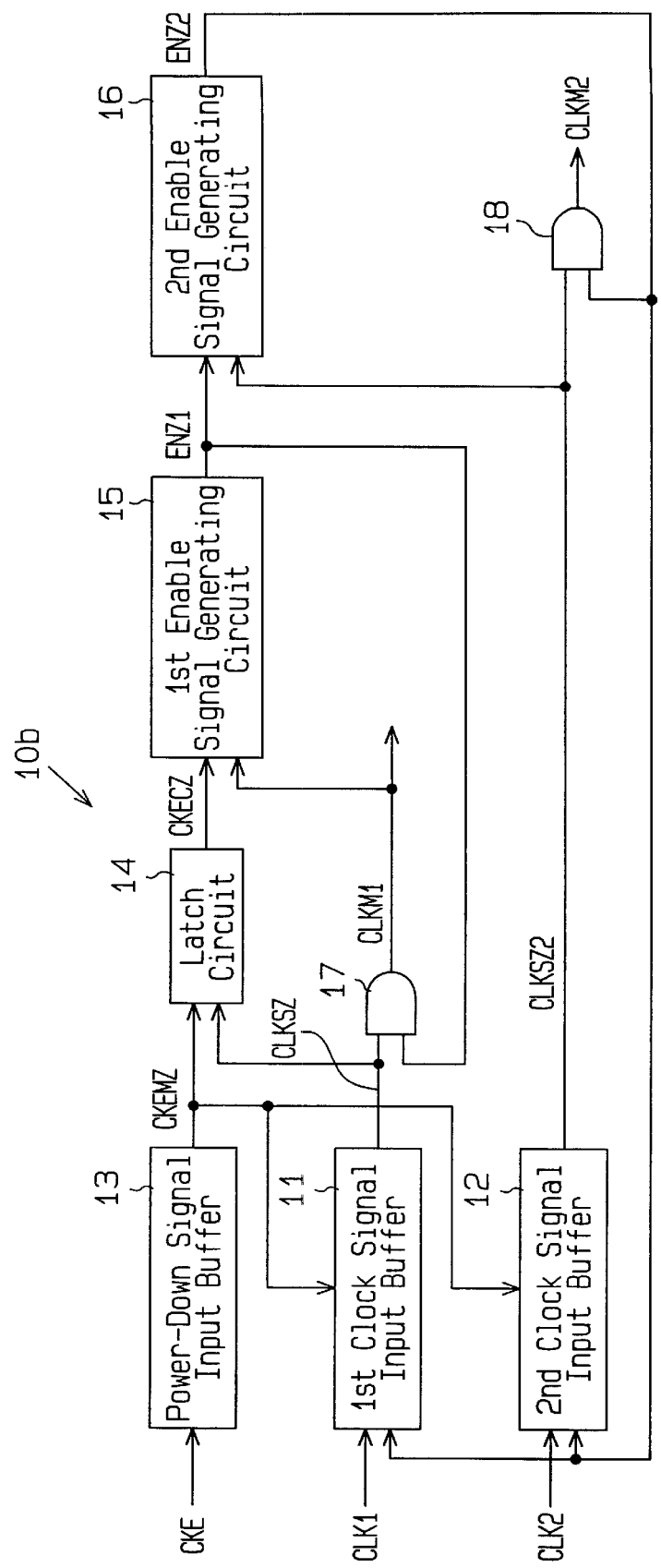
FIG. 12 is a schematic block diagram showing an internal clock signal generating circuit according to a second embodiment of the present invention.

FIG. 12 is a schematic block diagram showing an internal clock signal generating circuit 10b according to a second embodiment of the present invention. In the internal clock signal generating circuit 10b, the second enable signal generating circuit 16 latches the first enable signal ENZ1 when a second clock signal CLKSZ2, which phase is substantially the same as the second external clock signal CLK2 is high, and the first enable signal generating circuit 15 latches the internal power-down signal CKECZ when the first internal clock signal CLKM1 is high. In this case, when the external power-down signal CKE (the main power-down signal CKEMZ) falls, the first internal clock signal CLKM1 is always invalidated earlier by half a cycle than the second internal clock signal CLKM2. Furthermore, when the external power-down signal CKE (the main power-down signal CKEMZ) rises, the first internal clock signal CLKM1 is always validated earlier by half a cycle than the second internal clock signal CLKM2.

In the second embodiment, the second clock signal input buffer 12 is activated when either a main-power down signal CKEMZ, which is sent from the power-down signal input buffer 13, or a second enable signal ENZ2, which is sent from the second enable signal generating circuit 16, is high. The second clock signal input buffer 12 is deactivated when the main power-down signal CKEMZ and the second enable signal ENZ2 are both low.

The internal clock signal generating circuit 10b includes a second gate circuit 18 for receiving the second clock signal CLKSZ2 and the second enable signal ENZ2 and generating the second internal clock signal CLKM2.

Third Embodiment

Figure 13:
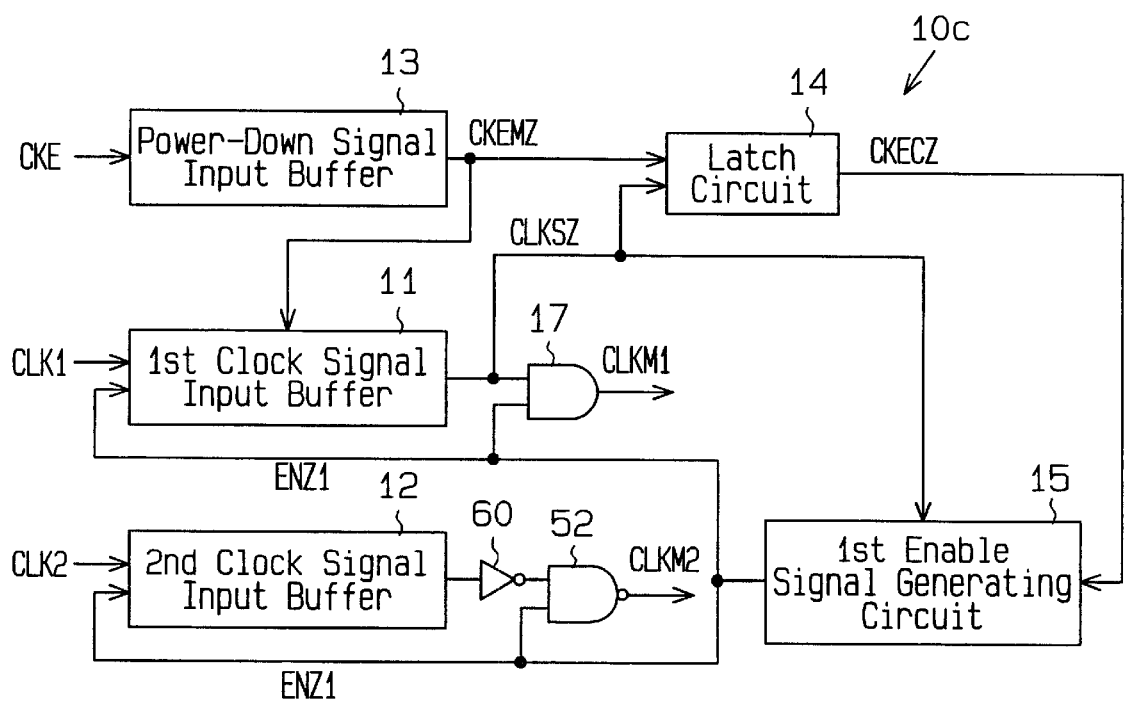
FIG. 13 is a schematic block diagram showing an internal clock signal generating circuit employed in a third embodiment according to the present invention.

FIG. 13 is a schematic block diagram showing an internal clock signal generating circuit 10c according to a third embodiment of the present invention. In the internal clock signal generating circuit 10c, the second enable signal generating circuit 16 is eliminated and a second gate circuit 52 is provided. The second gate circuit 52 controls the output of the second internal clock signal CLKM2, which is provided by the second clock signal input buffer 12, in accordance with the first enable signal ENZ1 output, which is provided by the first enable signal generating circuit 15. The second gate circuit 52 is preferably a two input NAND circuit. That is, the second gate circuit 52 has a first input terminal, which receives the second internal clock signal CLKM2 sent from the second clock signal input buffer 12 by way of an inverter 60, and a second input terminal, which receives the first enable signal ENZ1 sent from the first enable signal generating circuit 15.

The first enable signal ENZ1 sent from the first enable signal generating circuit 15 is used to activate or deactivate the first and second clock signal input buffers 11, 12.

Figure 14:
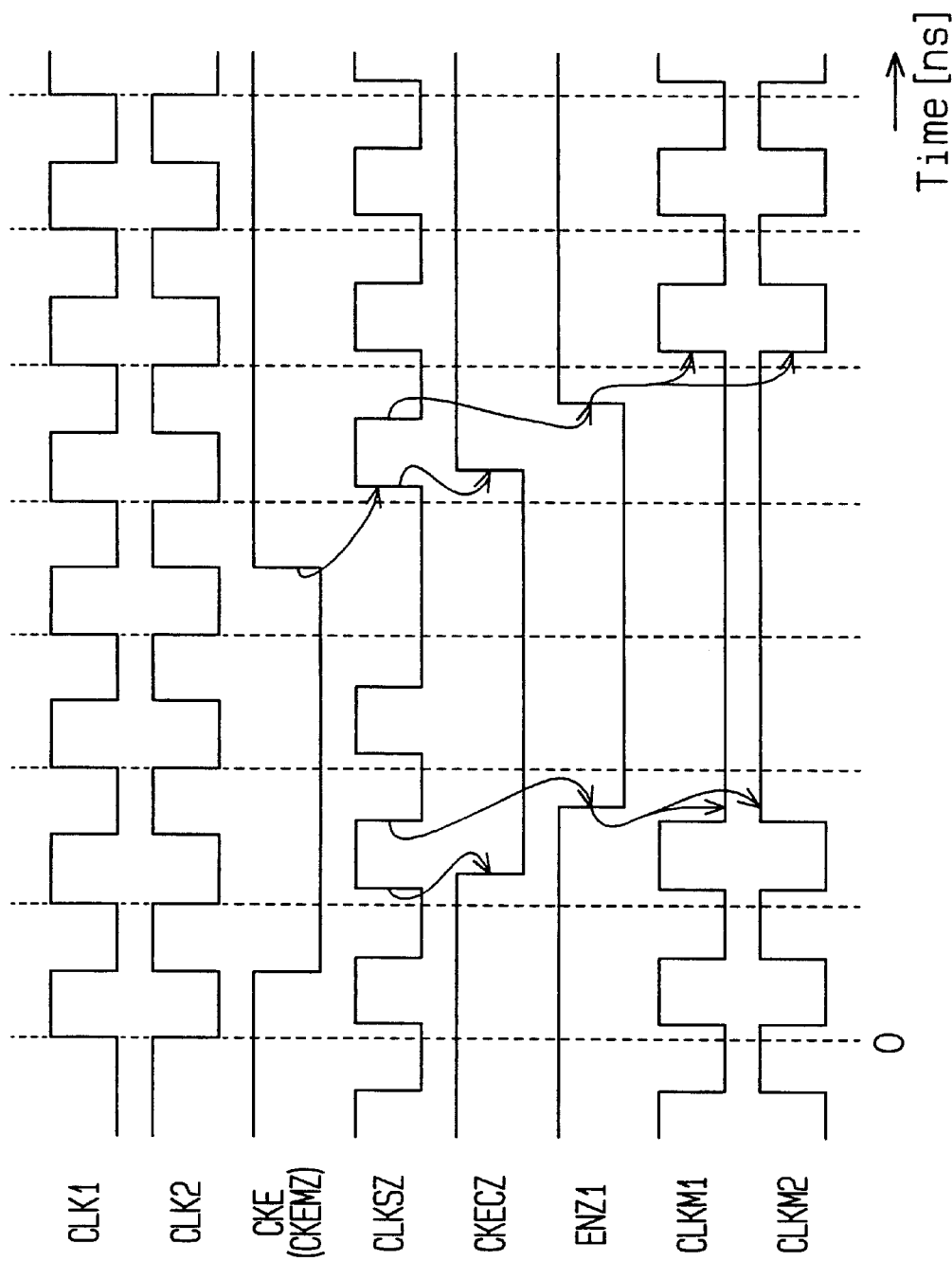
FIG. 14 is a timing chart showing the operation of the internal clock signal generating circuit of FIG. 13.

FIG. 14 is a timing chart showing the operation of the internal clock signal generating circuit 10c. In the third embodiment, the first internal clock signal CLKM1 is always validated and invalidated a half cycle earlier than the second internal clock signal CLKM2. In this case, the first internal clock signal CLKM1 is invalidated when low, and the second internal clock signal CLKM2 is invalidated when high. Since the second enable signal generating circuit 16 is eliminated, the clock signal generating circuit 10c occupies less space than that of FIG. 4.

Fourth Embodiment

Figure 15:
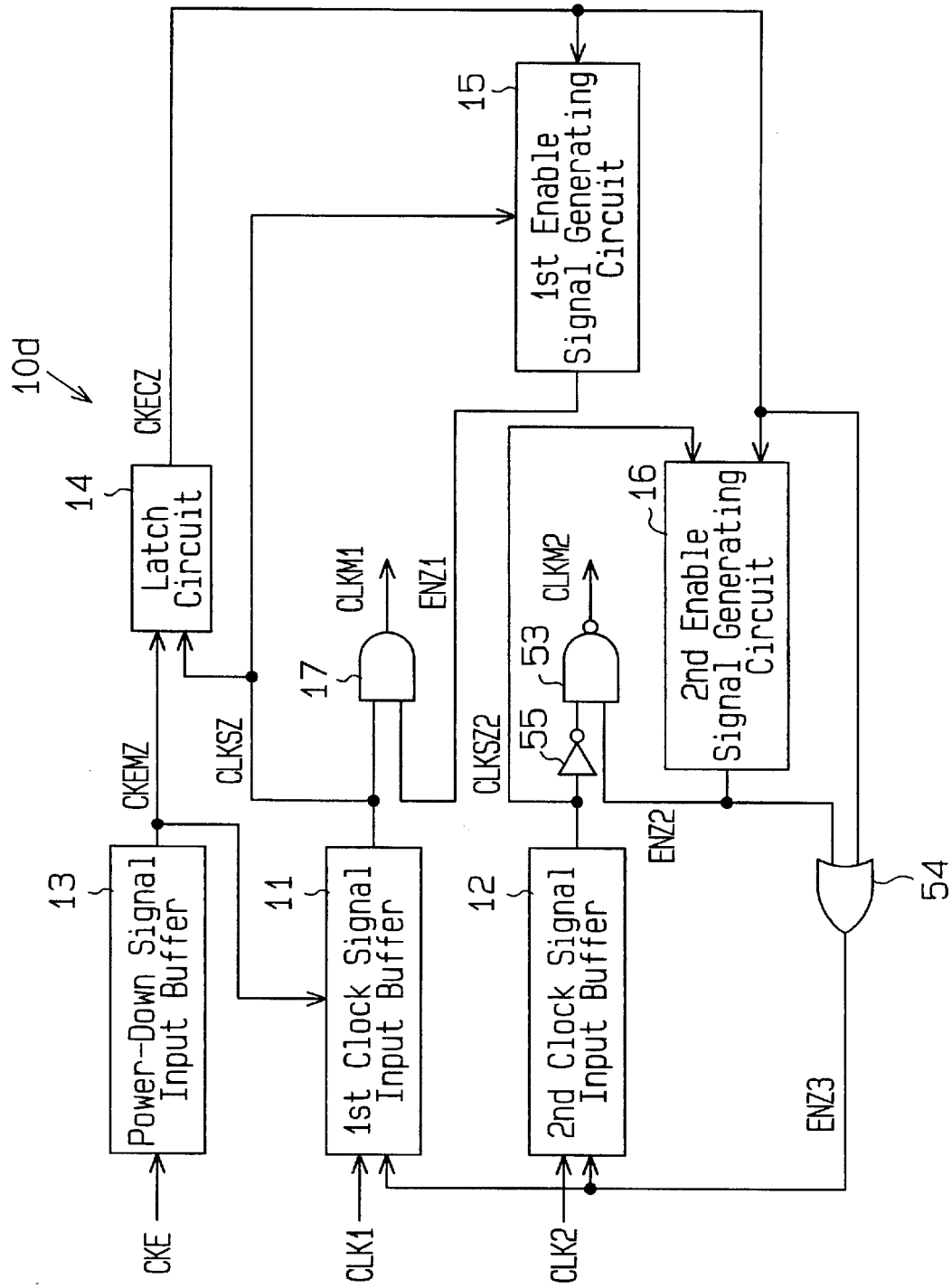
FIG. 15 is a schematic block diagram showing an internal clock signal generating circuit according to a fourth embodiment of the present invention.

FIG. 15 is a schematic block diagram showing an internal clock signal generating circuit 10d according to a fourth embodiment of the present invention. In the internal clock signal generating circuit 10d, the second enable signal generating circuit 16 receives the internal power-down signal CKECZ from the latch circuit 14 and the second internal clock signal CLKM2 from the second clock signal input buffer 12. Furthermore, a second gate circuit 53 is provided to control the output of the second clock signal CLKSZ2 as the second internal clock signal CLKM2 sent from the second clock signal input buffer 12 via an inverter 55, in accordance with the second enable signal ENZ2. A third gate circuit 54 receives the internal power-down signal CKECZ from the latch circuit 14, and the second enable signal ENZ2, which is sent from the second enable signal generating circuit 16, to generate a third enable signal ENZ3. The second gate circuit 53 is preferably a two input AND circuit. The third gate circuit 54 is preferable a two input OR circuit. The first and second clock signal input buffers 11, 12 receive the third enable signal ENZ3 from the third gate (OR) circuit 54.

Figure 16:
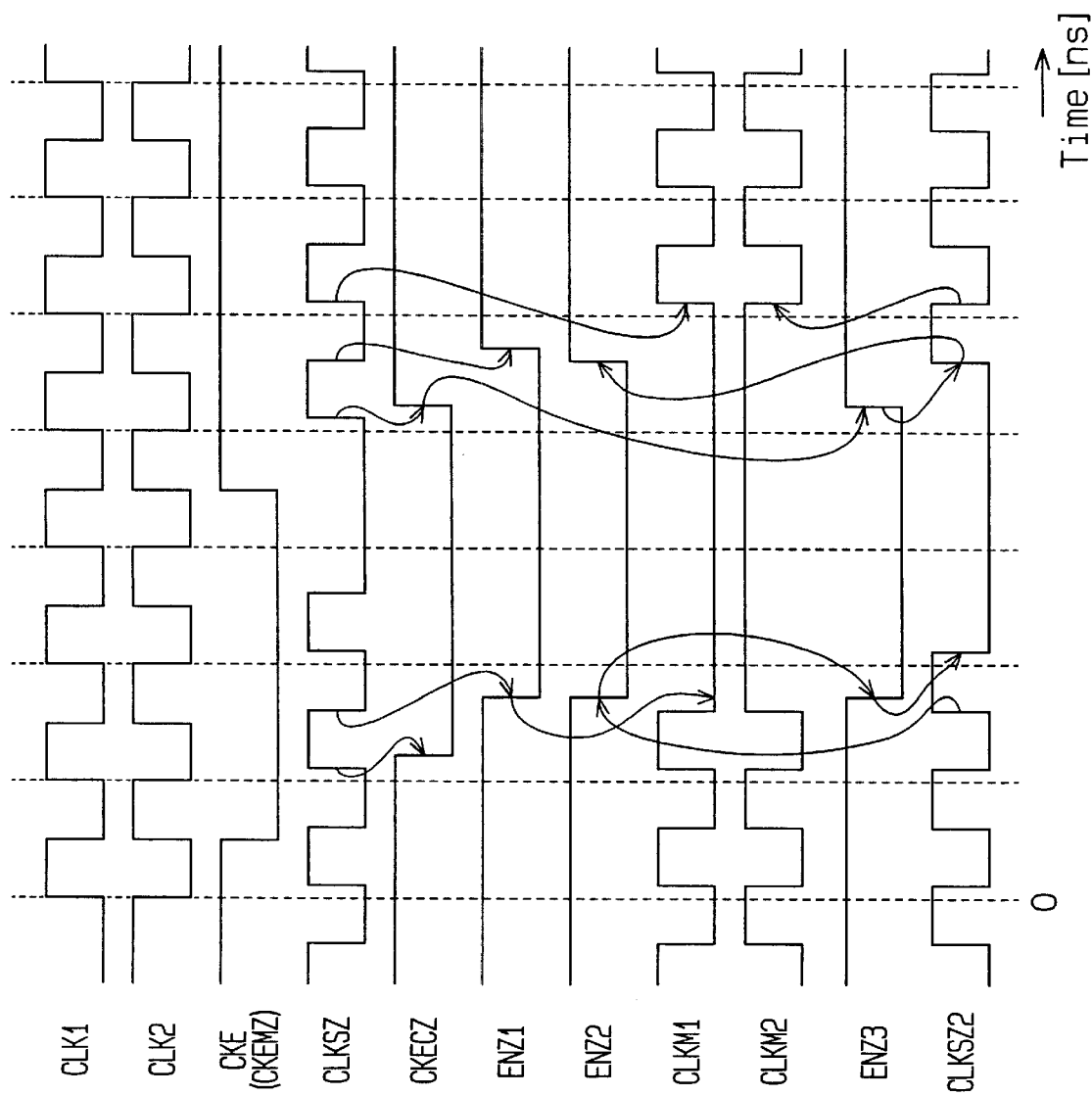
FIG. 16 is a timing chart showing the operation of the internal clock signal generating circuit of FIG. 15.

FIG. 16 is a timing chart showing the operation of the internal clock signal generating circuit 10d. The second enable signal generating circuit 16 latches the internal power-down signal CKECZ sent from the latch circuit 14 in response to the rising of the internal clock signal sent from the second clock signal input buffer 12. That is, the second enable signal generating circuit 16 latches the internal power-down signal CKECZ from the latch circuit 14 at substantially the same timing as the first enable signal generating circuit 15. Thus, the third enable signal ENZ3 is sent to the first and second clock signal input buffers 11, 12 at substantially the same timing as the first or second enable signals ENZ1 or ENZ2. Accordingly, the first internal clock signal CLKM1 is always validated or invalidated a half cycle earlier than the second internal clock signal CLKM2.

It should be apparent to those skilled in the art that the present invention may be embodied in many other specific forms without departing from the spirit or scope of the invention. Particularly, it should be understood that the present invention may be embodied in the following forms.

The present invention may be embodied in a semiconductor integrated circuit, such as a semiconductor memory device or a signal processing device, which includes an SDRAM for providing clock signals of different phases to a plurality of internal circuit sections.

The present invention may be embodied in a generating circuit that generates three or more internal clock signals, each having a phase which differs from the others.

The phase difference between the first and second internal clock signals CLKM1, CLKM2 is not limited to 180°.

The present examples and embodiments are to be considered as illustrative and not restrictive, and the invention is not to be limited to the details given herein, but may be modified within the scope and equivalence of the appended claims.

What is claimed is:

1. A semiconductor integrated circuit comprising:
    a plurality of clock signal input circuits, each receiving a respective one of a plurality of external clock signals and generating a respective one of a plurality of internal clock signals;
    an external control signal input circuit for receiving an external control signal and generating an internal control signal; and
    an output control circuit, coupled to the plurality of clock signal input circuits and the external control signal input circuit, for receiving the internal control signal from the external control signal input circuit and validating and invalidating the internal clock signals at a predetermined timing by selectively activating and deactivating the plurality of clock signal input circuits in accordance with changes in the internal control signal.

2. The integrated circuit according to claim 1, wherein the internal control signal shifts between an active state and an inactive state, and wherein the output control circuit validates and invalidates the internal clock signals at a predetermined timing by selectively activating and deactivating the plurality of clock signal input circuits such that the internal clock signals always have a substantially constant relationship when the internal control signal shifts from an inactive state to an active state.

3. The integrated circuit according to claim 1, wherein the internal control signal shifts between an active state and an inactive state, and wherein the output control circuit validates and invalidates the internal clock signals at a predetermined timing by selectively activating and deactivating the plurality of clock signal input circuits such that the internal clock signals always have a substantially constant relationship when the internal control signal shifts from an active state to an inactive state.

4. The integrated circuit according to claim 1, wherein the internal control signal shifts between an active state and an inactive state, and wherein the output control circuit validates and invalidates the internal clock signals at a predetermined timing by selectively activating and deactivating the plurality of clock signal input circuits such that the internal clock signals always have a substantially constant relationship when the internal control signal shifts from an inactive state to an active state and from an active state to an inactive state.

5. A semiconductor integrated circuit comprising:
- a first clock signal input buffer and a second clock signal input buffer for receiving first and second external clock signals, each having a different phase, and generating first and second internal clock signals, each having a different phase, respectively;
- a power-down signal input buffer for receiving an external power-down signal and generating an internal power-down signal; and
- an output control circuit, coupled to the first and second clock signal input buffers and the power-down signal input buffer, for receiving the internal power down signal from the power-down signal input buffer, and validating and invalidating the first and second internal clock signals at a predetermined timing by selectively activating and deactivating the first and second clock signal input buffers in accordance with changes in the internal power-down signal.

6. The integrated circuit according to claim 5, wherein the internal power-down signal shifts between an active state and an inactive state, and wherein the output control circuit validates and invalidates the first and second internal clock signals at a predetermined timing by selectively activating and deactivating the first and second clock signal input buffers such that the first and second internal clock signals always have a substantially constant relationship when the internal power-down signal shifts from an inactive state to an active state.

7. The integrated circuit according to claim 5, wherein the internal power-down signal shifts between an active state and an inactive state, and wherein the output control circuit validates and invalidates the first and second internal clock signals at a predetermined timing by selectively activating and deactivating the first and second clock signal input buffers such that the first and second internal clock signals always have a substantially constant relationship when the internal power-down signal shifts from an active state to an inactive state.

8. The integrated circuit according to claim 5, wherein the internal power-down signal shifts between an active state and an inactive state, and wherein the output control circuit validates and invalidates the first and second internal clock signals at a predetermined timing by selectively activating and deactivating the first and second clock signal input buffers such that the first and second internal clock signals always have a substantially constant relationship when the internal power-down signal shifts from an inactive state to an active state and from an active state to an inactive state.

9. The integrated circuit according to claim 5, wherein the internal power-down signal shifts between an active state and an inactive state, and wherein the output control circuit validates the second internal clock signal after validating the first internal clock signal when the internal power-down signal shifts from an inactive state to an active.

10. The integrated circuit according to claim 5, wherein the internal power-down signal shifts between an active state and an inactive state, and wherein the output control circuit invalidates the second internal clock signal after invalidating the first internal clock signal when the internal power-down signal shifts from an active state to an inactive.

* * * * *